US011713240B2

(12) United States Patent
Pourkamali et al.

(10) Patent No.: US 11,713,240 B2
(45) Date of Patent: Aug. 1, 2023

(54) CELLULAR ARRAY ELECTROSTATIC ACTUATOR

(71) Applicant: Board of Regents, The University of Texas System, Austin, TX (US)

(72) Inventors: Siavash Pourkamali, Richardson, TX (US); Amin Abbasalipour, Dallas, TX (US); Prithviraj Palit, Dallas, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 177 days.

(21) Appl. No.: 17/116,677

(22) Filed: Dec. 9, 2020

(65) Prior Publication Data

US 2021/0171339 A1  Jun. 10, 2021

Related U.S. Application Data

(60) Provisional application No. 62/945,561, filed on Dec. 9, 2019.

(51) Int. Cl.
| | |
|---|---|
| *B81C 1/00* | (2006.01) |
| *H02N 1/00* | (2006.01) |
| *B81B 3/00* | (2006.01) |
| *H02N 2/00* | (2006.01) |

(52) U.S. Cl.
CPC ........ *B81C 1/00166* (2013.01); *B81B 3/0021* (2013.01); *B81C 1/00214* (2013.01); *H02N 1/008* (2013.01); *H02N 2/0075* (2013.01); *B81B 2201/033* (2013.01); *B81B 2203/0136* (2013.01); *B81B 2203/053* (2013.01)

(58) Field of Classification Search
CPC .. B81B 3/0021; B81C 1/00214; H02N 1/008; H02N 2/0075
See application file for complete search history.

(56) References Cited

U.S. PATENT DOCUMENTS

| | | | | |
|---|---|---|---|---|
| 4,356,730 | A | * | 11/1982 | Cade ...................... G11C 13/04 348/771 |
| 5,206,557 | A | | 4/1993 | Bobbio |
| 5,479,061 | A | * | 12/1995 | Bobbio .................. H02N 1/006 310/309 |
| 5,642,015 | A | * | 6/1997 | Whitehead ............. H02N 1/006 310/309 |

(Continued)

OTHER PUBLICATIONS

Holger Conrad, Harald Schenk, Bert Kaiser, Sergiu Langa, Matthieu Gaudet, Klaus Schimmanz, Michael Stolz, Miriam Lenz, A Small-gap electrostatic micro-actuator for large deflections, Nature Communications, Dec. 11, 2015, pp. 1-7, Germany.

(Continued)

*Primary Examiner* — Bernard Rojas
(74) *Attorney, Agent, or Firm* — Yee & Associates, P.C.

(57) ABSTRACT

Illustrative embodiments provide an electrostatic actuator and methods of making and operating an electrostatic actuator. The electrostatic actuator comprises a framework and a plurality of electrodes. The framework comprises walls defining a plurality of cells forming an array of cells. The plurality of electrodes comprise an electrode in each cell in the plurality of cells. A gap separates the electrode in each cell from the walls of the cell. The framework is configured to contract in response to an electrical signal applied between the framework and the plurality of electrodes.

6 Claims, 13 Drawing Sheets

(56) References Cited

U.S. PATENT DOCUMENTS

| | | | | |
|---|---|---|---|---|
| 7,196,599 | B2* | 3/2007 | Dabbaj | H02N 1/006 |
| | | | | 335/78 |
| 7,453,339 | B2* | 11/2008 | Fork | H01H 59/0009 |
| | | | | 335/78 |
| 9,350,271 | B2 | 5/2016 | Gutierrez | |
| 10,122,300 | B2 | 11/2018 | Gutierrez | |
| 2014/0339653 | A1* | 11/2014 | Chang | H01L 41/125 |
| | | | | 257/415 |

OTHER PUBLICATIONS

N. Golay, A. Masse, Y.Petremand, W.Noell, J.-F. Manceau, N.F. de Rooij, Scalable Cascaded Snap-in Actuators for Large-Stroke displacements, Nov. 10, 2020, pp. 1754-1757, IEEE Xplore, France.

J C Chiou, Y J Lin, A novel large displacement electrostatic actuator: pre-stress comb-drive actuator, Journal of Micromechanics and Microengineering, 2005, pp. 1641-1648, Institute of Physics, UK.

* cited by examiner

CELLULAR ARRAY ELECTROSTATIC ACTUATOR

CROSS REFERENCE TO RELATED APPLICATION

This application is a utility conversion and claims priority to U.S. Ser. No. 62/945,561, filed Dec. 9, 2019, the contents of which are incorporated herein by reference in their entirety for all purposes.

BACKGROUND INFORMATION

1. Field

The present disclosure relates generally to electrostatic actuators. More particularly, the present disclosure relates to an electrostatic actuator comprising an array of cells that is microfabricated and has microscale feature sizes.

2. Background

An actuator is a component of a machine that is used to move the machine, a component of the machine, or another object. An electromechanical actuator is one example of an actuator. An electromechanical actuator is capable of converting electrical energy into mechanical motion. Electromechanical actuators are used in various applications, ranging from consumer electronics, optical systems, instrumentation and robotics to the automotive industry.

Different types of electromechanical actuators may be used in various different applications to provide different types of movement at various different scales. Electric motors and solenoids, piezoelectric actuators, and electrostatic actuators are examples of different types of electromechanical actuators. Electric motors and solenoids produce movement based on electromagnetic forces generated by electric current in wire coils. Piezoelectric actuators produce movement based on the piezoelectric effect, the internal generation of a mechanical strain resulting from an applied electric field in some materials.

An electrostatic actuator produces movement based on the electrostatic force that is generated between two conducting electrodes when a voltage is applied between them. Depending on the arrangement of the electrodes, various types of electrostatic actuators are possible. It may be desirable to improve on the capability provided by current electrostatic actuators and increase the number of applications for which electrostatic actuators may be used.

Therefore, there may be a need for an apparatus and method that take into account at least some of the issues discussed above, as well as other possible issues.

SUMMARY

The illustrative embodiments provide an electrostatic actuator comprising a framework and a plurality of electrodes. The framework comprises walls defining a plurality of cells forming an array of cells. The plurality of electrodes comprise an electrode in each cell in the plurality of cells. A gap separates the electrode in each cell from the walls of the cell. The framework is configured to contract in response to an electrical signal applied between the framework and the plurality of electrodes.

Illustrative embodiments also provide a method of operating an electrostatic actuator. An electrical signal is applied between a framework and a plurality of electrodes of the electrostatic actuator to cause the framework to contract. The framework comprises walls defining a plurality of cells forming an array of cells. The plurality of electrodes comprise an electrode in each cell in the plurality of cells. The electrode in each cell is separated from the walls of the cell by a gap.

Illustrative embodiments also provide a method of making an electrostatic actuator. Trenches are formed in a substrate to form walls of a framework. The walls define a plurality of cells forming an array of cells. A sacrificial layer is formed on the walls. The trenches are filled with a layer of polysilicon to form electrodes in the cells. The sacrificial layer is then removed to form gaps between the walls and the electrodes in the cells.

Further objects, features, and advantages will be apparent from the following detailed description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

DETAILED DESCRIPTION

Figure 1:
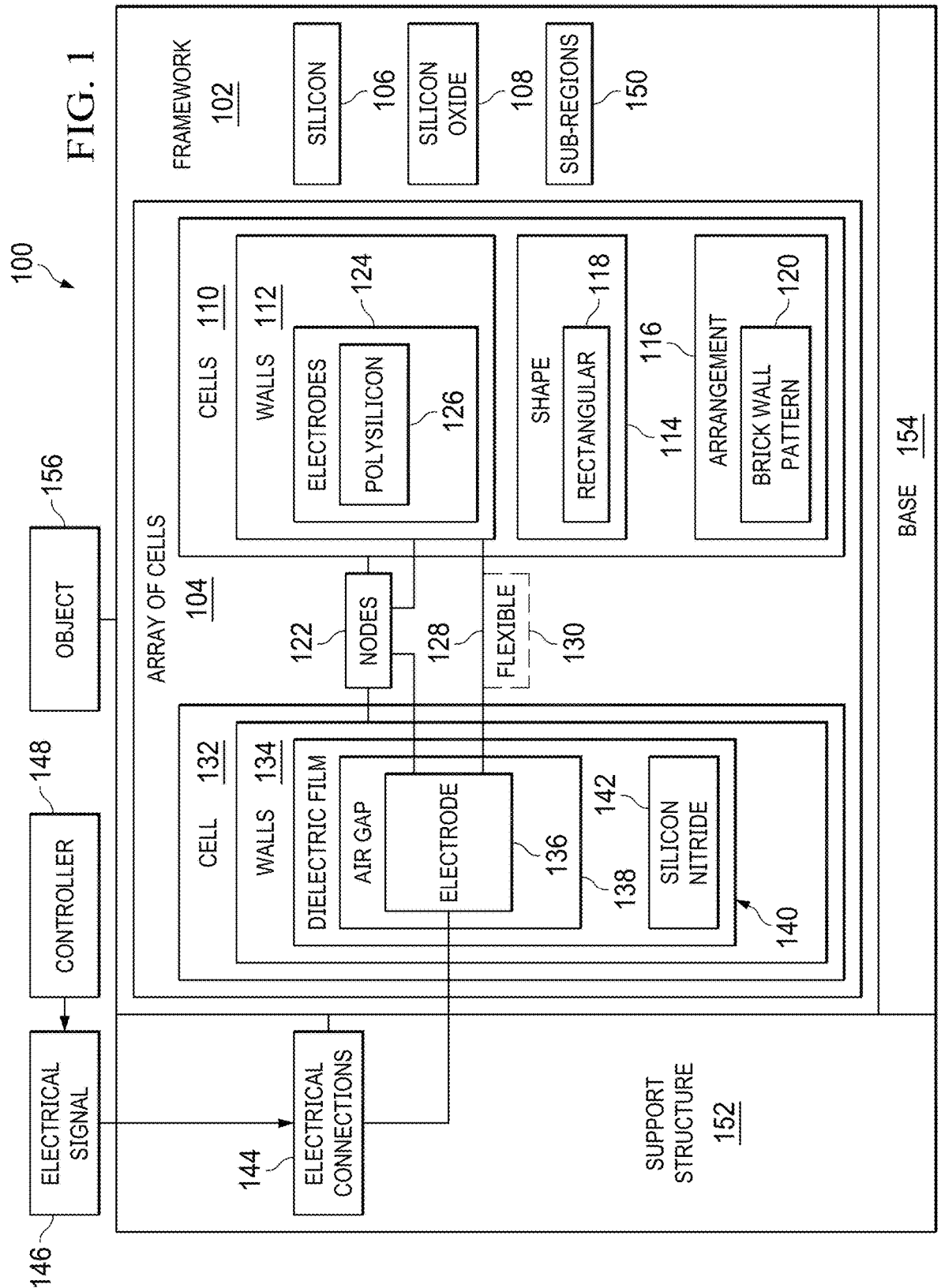
FIG. 1 is a schematic block diagram of a cellular array electrostatic actuator in accordance with an illustrative embodiment.

The illustrative embodiments recognize and take into account various considerations. For example, the illustrative embodiments recognize and take into account various limitations of electric motors and solenoids and piezoelectric actuators.

Electric motors and solenoids are relatively bulky and heavy, due, for example, to the metal core and wire windings used in such devices. Electric motors and solenoids also may be relatively noisy and power inefficient. Electric motors and solenoids may be especially power inefficient in applications that require very low speed or stop and hold operation, such as robotics.

Piezoelectric material, such as bulk piezoelectric lead zirconate titanate, PZT, may be used as actuators in relatively high precision positioning systems. Such piezoelectric actuators typically may reach a maximum strain of approximately 0.1%, for example, approximately 10 micrometer displacement for a 1 centimeter long block of material. Typical piezoelectric actuators may require actuation voltages in excess of 100 volts to reach such strains.

The illustrative embodiments also recognize and take into account that microelectromechanical actuators with relatively large displacement ranges may be useful for various applications. For example, without limitation, microelectromechanical actuators with relatively large displacement ranges may be used in robotics and microrobotics, miniature lens positioning for automatic focusing, zooming or optical image stabilization, micro-positioning stages, and other applications. Such applications may require displacement ranges from tens of micrometers to millimeters and actuation forces in the mN range.

The illustrative embodiments also recognize and take into account that electrostatic actuators are relatively energy efficient and have relatively fast response time. The relatively low structural stiffness of electrostatic actuators allows relatively wide displacement ranges.

Illustrative embodiments also recognize and take into account that the electrostatic force between electrodes in an electrostatic actuator is inversely related to the square of the distance between the electrodes. Therefore, the force generated by an electrostatic actuator may be significantly increased by shrinking the gap between the electrodes. Furthermore, smaller gaps can withstand much larger electric fields than larger scale gaps. For example, smaller gaps in the range of a few micrometers and below may withstand relatively large electric fields of hundreds of MV/m compared to the known breakdown field of air for larger scale gaps of approximately 3 MV/m.

Illustrative embodiment also recognize and take into account, however, that the maximum displacement of an electrostatic actuator is limited to the distance between electrodes. Therefore, reducing the gap between the electrodes in an electrostatic actuator to increase the force generated also reduces the maximum displacement of the actuator.

Illustrative embodiments recognize the potential for microelectromechanical electrostatic actuators to realize high energy density with relatively simple structures, materials and fabrication. Illustrative embodiments provide a cellular array electrostatic actuator that is inspired by the cellular structure of biological muscles and that may be made by micromachining. A cellular array electrostatic actuator in accordance with an illustrative embodiment bypasses the trade-off between maximum displacement and generated force by summing up displacements from many cascaded actuator cells with individual submicrometer displacements. Cellular array electrostatic actuators in accordance with an illustrative embodiment combine larger range of motion and scalability along with larger force and energy densities compared to conventional electrostatic actuators.

Microelectromechanical electrostatic actuators in accordance with illustrative embodiments may be adopted for a wide range of applications. Cellular array electrostatic actuators in accordance with illustrative embodiments offer orders of magnitude larger displacement and work densities compared to conventional electromagnetic and piezoelectric actuators. Cellular array electrostatic actuators in accordance with illustrative embodiments may replace piezoelectric and electromagnetic actuators in some existing applications. For example, without limitation, cellular array electrostatic actuators in accordance with illustrative embodiments may be used in compact optical systems and camera modules, robotics, microrobotics, surgical devices, precision positioning systems and instrumentation, and other appropriate applications. As a further example, a cellular array electrostatic actuator in accordance with an illustrative embodiments may be used to move the lens of a compact camera module, such as the lens of a smartphone camera, for focusing and zooming, as well as optical image stabilization. Such actions are currently performed by electromagnetic coils which consume significantly more power than electrostatic actuators.

Turning to FIG. 1, a schematic block diagram of a cellular array electrostatic actuator is depicted in accordance with an illustrative embodiment. Cellular array electrostatic actuator 100 includes framework 102 comprising array of cells 104. Framework 102 may be made of an appropriate conductive material. For example, without limitation, framework 102 may be made of an appropriate metal, doped semiconductor, or another appropriate conductive material.

Array of cells 104 comprises a plurality of cells 110. In accordance with an illustrative embodiment, cells 110 in array of cells 104 are hollow cells formed between walls 112. Walls 112 completely surround and thus define the hollow portions of cells 110.

Array of cells 104 may include any appropriate number of cells 110 having any appropriate size, shape 114, and arrangement 116. As used herein, including in the claims, unless explicitly stated otherwise, shape 114 of cells 110 refers to the shape of cells 110 in a plane that extends through cells 110 perpendicular to all of walls 112 forming cells 110. Similarly, as used herein, including in the claims, unless explicitly stated otherwise, arrangement 114 of cells 110 refers to the arrangement of cells 110 in a plane that extends through cells 110 perpendicular to all of walls 112 forming cells 110. For example, all walls 112 forming cells 110 in array of cells 104 may extend substantially parallel to each other in a first direction. In this case, shape 114 of cells 110 is the shape of cells 110 in a plane that extends through cells 110 perpendicular to the first direction and arrangement 116 of cells 110 is the arrangement of cells 110 in the plane that extends through cells 110 perpendicular to the first direction.

For example, without limitation, shape 114 of cells 110 in array of cells 104 may be substantially rectangular 118. In this case, arrangement 116 of cells 110 in array of cells 104 may form brick wall pattern 120. Any other appropriate shape 114 and arrangement 116 of cells 110 may be used to form array of cells 104. Shape 114 and arrangement 116 of cells 110 in array of cells 104 may be substantially the same across array of cells 104. Alternatively, cells 110 in different parts of array of cells 104 may have different shapes, different arrangements, or different shapes and arrangements.

Points in framework 102 comprise nodes 122. For example, without limitation, nodes 112 may comprise points in framework 102 at which walls 112 forming cells 110 in array of cells 104 are connected together. During operation of cellular array electrostatic actuator 100, walls 112 of cells 110 are deformed, leading to contraction of framework 102 as a whole. However, deformation at nodes 122 of framework 102 during operation of cellular array electrostatic actuator 100 is less than the deformation of other portions of walls 112 during operation of cellular array electrostatic actuator 100. Preferably, there may be almost no deformation at nodes 122 of framework 102 during operation of cellular array electrostatic actuator 100.

Cellular array electrostatic actuator 100 further comprises plurality of electrodes 124 in cells 110 in array of cells 104. For example, without limitation, electrodes 124 may be made of polysilicon 126 or another appropriate material. The shape and arrangement of electrodes 124 preferably corresponds to shape 114 and arrangement 116 of the corresponding cells 110 in which electrodes 124 are positioned.

Electrodes 124 may be electrically connected together by electrical interconnects 128. Electrical interconnects 128 may be implemented in any appropriate manner. However, electrical interconnects 128 between electrodes preferably are flexible 130 so that the whole network of interconnected electrodes 124 is able to contract along with framework 102 during operation of cellular array electrostatic actuator 100.

Electrodes 124 are preferably attached to framework 102 at nodes 122, where there is preferably little or no deformation during operation of cellular array electrostatic actuator 100. Attaching electrodes 124 to framework 102 at nodes 122 provides adequate stiffness for electrodes 124 to pull walls 112 toward electrodes 124 during the operation of cellular array electrostatic actuator 100 without electrodes 124 being deformed or pulled into contact with walls 112.

Each cell 132 in array of cells 104 thus is defined by walls 134, and electrodes 124 include electrode 136 in each cell 132 in array of cells 104. Electrode 136 is located in the hollow portion of cell 132 that is surrounded and defined by walls 134 of cell 132 and is separated from walls 134 of cell 132 by gap 138. For example, without limitation, each cell 132 in array of cells 104 may comprise two submicrometer wide high aspect ratio capacitive gaps between walls 134 of cell 132 and electrode 136.

The width of gap 138, that is, the distance between walls 134 of cell 132 and electrode 136, may be selected as appropriate for the desired electrostatic force to be generated and displacement to be provided by cell 132. Gap 138 having a larger width will provide for greater displacement but less force. Gap 138 having a smaller width will provide for less displacement but more force.

Gap 138 may be filled with air, in which case gap 138 may be referred to as an air gap. However, gap 138 may contain any other appropriate dielectric gas, fluid, or flexible material. For example, without limitation, gap 138 may be filled with a dielectric liquid or an elastomer. The material filling gap 138 may be selected as appropriate for a particular application of cellular array electrostatic actuator 100 in accordance with an illustrative embodiment. The material filling gap 138 may be advantageously selected to obtain force proportional to the dielectric constant of the material. Gap 138 may contain a vacuum in some applications.

Walls 134 of cell 132 preferably may be covered with dielectric film 140. Dielectric film 140 preferably is located on walls 134 between walls 134 and gap 138 between walls 134 and electrode 136. Dielectric film 140 may comprise silicon nitride 142, such as low stress silicon nitride, or any other appropriate dielectric material.

Dielectric film 140 prohibits short circuits between electrodes 124 biased at high voltages and framework 102 upon contact between electrodes 124 and framework 102. Dielectric film 140 also may increase the breakdown field of gap 138 by blocking flow of electrons due to field emission or tunneling. In addition, silicon nitride 142 is known to lower stiction between touching surfaces. Therefore, dielectric film 140 comprising silicon nitride 142 may reduce the possibility of electrodes 124 sticking to framework 102 upon contact.

The electrostatic attracting force for parallel plates with dielectric covered walls is given by:

$$F_{elec.pp} = \frac{\varepsilon_0 A V_{act}^2}{2\left(g + \frac{t_{di}}{\varepsilon_r}\right)^2}.$$

where $\varepsilon_0$ is the permittivity of free space ($8.85*10^{-12}$ F/m), A is the electrode area, $V_{act}$ is the actuation voltage, g is the width of the gap, $t_{di}$ is the dielectric thickness, and $\varepsilon_r$ is the relative permittivity of the dielectric film.

Cellular array electrostatic actuator 100 may include appropriate electrical connections 144 for providing electrical signal 146 between framework 102 and electrodes 124 to operate cellular array electrostatic actuator 100. Electrical connections 144 may be implemented in any appropriate manner.

For example, without limitation, electrical signal 146 may comprise an actuation voltage applied between framework 102 and electrodes 124. Upon application of this electrical signal 146 between framework 102 and electrodes 124, lateral electrostatic forces will pull walls 112 of cells 110 toward electrodes 124, causing framework 102 as a whole to contract.

Electrical signal 146 to operate cellular array electrostatic actuator 100 may be provided in any appropriate manner. For example, electrical signal 146 may be generated and provided to cellular array electrostatic actuator 100 by controller 148. Controller 148 may be implemented in any appropriate manner to generate and provide electrical signal 146 for operation of cellular array electrostatic actuator 100.

For example, without limitation, controller 148 may be implemented in hardware or in hardware in combination with software.

Electrical connections 144 may be configured such that electrical signal 146 may be provided independently to various different sub-regions 150 of cellular array electrostatic actuator 100. Sub-regions 150 may include various different portions of framework 102 that include subsets of cells 110 in array of cells 104 and corresponding subsets of electrodes 124. Sub-regions 150 may or may not overlap, such that any particular cell 132 in array of cells 104 may be included in one or more sub-regions 150. By providing electrical signal 146 independently to different sub-regions 150 of cellular array electrostatic actuator 100, various different portions of framework 102 may be made to contract at different times, in different ways, or both, to cause framework 102 as a whole to move in a desired manner.

Framework 102 of cellular array electrostatic actuator 100 may be attached to support structure 152. For example, without limitation, support structure 152 may include any appropriate structure whereby cellular array electrostatic actuator 100 may be mounted for use. Framework 102 may be attached to support structure 152 such that framework 102 contracts with respect to support structure 152 during operation of cellular array electrostatic actuator 100. For example, without limitation, framework 102 may be attached to support structure 152 along one side of framework 102 such that framework 102 extends from support structure 152.

Support structure 152 may be made and framework 102 may be attached to support structure 152 in any appropriate manner. For example, without limitation, framework 102 may be integrally formed attached to support structure 152 during a process for making cellular array electrostatic actuator 100 by micromachining.

Appropriate portions of electrical connections 144 may be provided on support structure 152 for providing electrical signal 146 to cellular array electrostatic actuator 100. For example, without limitation, metal pads or other appropriate structures for connecting wires to cellular array electrostatic actuator 100 may be provided on support structure 152.

Framework 102 may be attached to base 154. For example, base 154 may comprise a relatively thin flexible film that extends across all or a portion of one side of framework 102 to connect together one side of all or a portion of cells 110 in array of cells 104. Cells 110 that are attached to base 154 will contract less on the side that is attached to base 154 than on the side that is not attached to base 154. Therefore, base 154 causes framework 102 to bend when framework 102 contracts during operation of cellular array electrostatic actuator 100. For example, without limitation, base 154 may be configured to cause framework 102 to bend in a desired manner when framework 102 contracts during operation of cellular array electrostatic actuator 100.

Base 154 may be made and framework 102 may be attached to base 154 in any appropriate manner. For example, without limitation, base 154 may comprise a residual thin film that is formed on one side of framework 102 during a process for making cellular array electrostatic actuator 100 by micromachining.

Cellular array electrostatic actuator 100 may be used to move object 156. For example, without limitation, object 156 may be a component of a machine or any other appropriate object. Object 156 may be moved by connecting object 156 in any appropriate manner to framework 102 such that the contraction, or bending and contraction, of framework 102 during operation of cellular array electrostatic actuator 100 moves object 156 in a desired manner. Framework 102 may be configured to include an appropriate structure for connecting object 156 to be moved to framework 102.

Cellular array electrostatic actuator 100 may be made in any appropriate manner. For example, without limitation, cellular array electrostatic actuator 100 may be made by micromachining. An example of a process for making a cellular array electrostatic actuator by micromachining is described below with reference to FIGS. 8 and 9.

The illustration of cellular array electrostatic actuator 100 in FIG. 1 is not meant to imply physical or architectural limitations to the manner in which illustrative embodiments may be implemented. Other components or structures, in addition to or in place of the ones illustrated, may be used. Some components or structures may be optional. Also, the blocks are presented to illustrate some functional components or structures. One or more of these blocks may be combined, divided, or combined and divided into different blocks when implemented in an illustrative embodiment.

Figure 2:
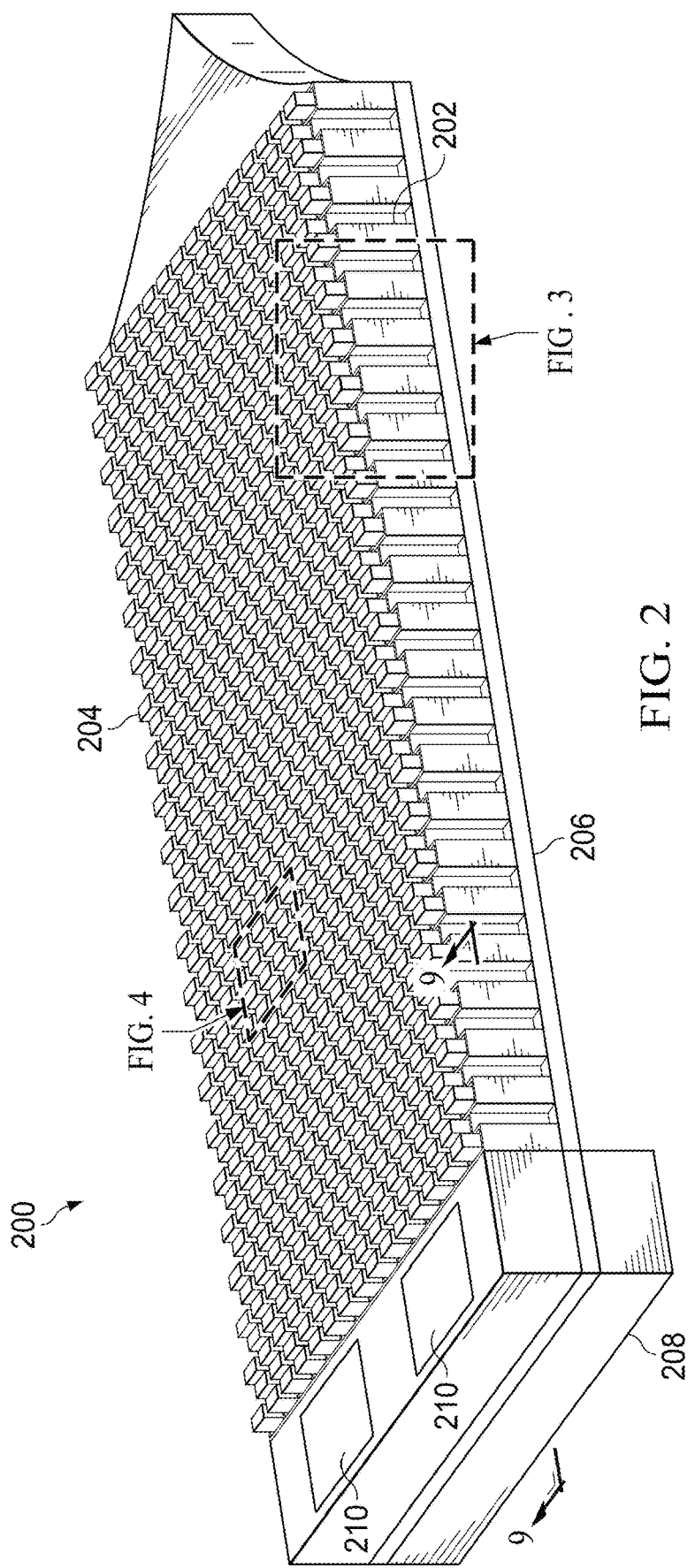
FIG. 2 is a perspective view illustration of a cellular array electrostatic actuator in accordance with an illustrative embodiment.

Turning to FIG. 2, a perspective view illustration of a cellular array electrostatic actuator is depicted in accordance with an illustrative embodiment. Cellular array electrostatic actuator 200 is an example of one implementation of cellular array electrostatic actuator 100 in FIG. 1.

Cellular array electrostatic actuator 200 includes silicon framework 202 comprising walls defining a plurality of cells forming an array of cells. In this example, polysilicon electrodes 204 extend into the cells in framework 202 from a top side of framework 202. Flexible polysilicon base 206 is on the bottom side of framework 202, on the opposite side of framework 202 from where polysilicon electrodes 204 extend into the cells.

Framework 202 is attached to and extends from support structure 208 such that framework 202 is suspended from support structure 208. In this example, electrical connections 210 are provided on support structure 208. Electrical connections 210 may be configured to have wires attached thereto for providing electrical signals to cellular array electrostatic actuator 200 for operation thereof in the manner described herein.

Figure 3:
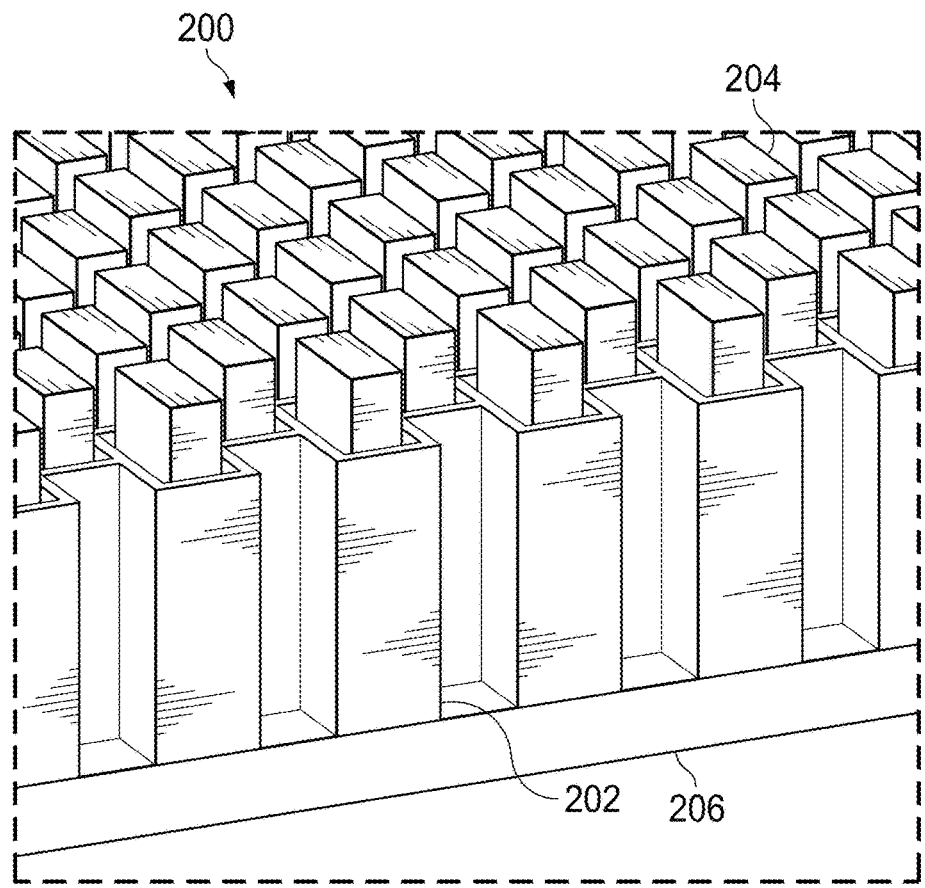
FIG. 3 is a close-up perspective view illustration of a portion of a cellular array electrostatic actuator in accordance with an illustrative embodiment.

Turning to FIG. 3, a close-up perspective view illustration of a portion of a cellular array electrostatic actuator is depicted in accordance with an illustrative embodiment. FIG. 3 is a close-up view of the portion of cellular array electrostatic actuator 200 indicated by box 3 in FIG. 2.

Figure 4:
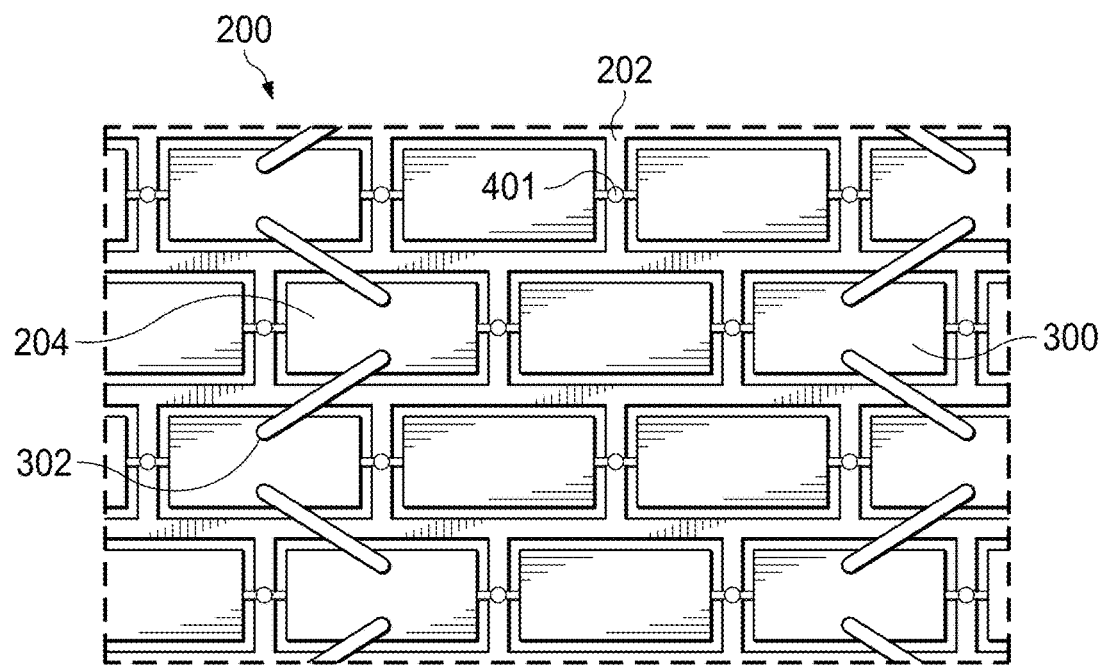
FIG. 4 is a close-up plan view illustration of a portion of a cellular array electrostatic actuator in accordance with an illustrative embodiment.

Turning to FIG. 4, a close-up plan view illustration of a portion of a cellular array electrostatic actuator is depicted in accordance with an illustrative embodiment. FIG. 4 is a close-up plan view of the portion of cellular array electrostatic actuator 200 indicated by box 4 in FIG. 2.

In this example, cells 300 in framework 202 are rectangular in shape and arranged in a brick wall pattern. Polysilicon electrical interconnects 302 provide electrical connections between electrodes 204 in cells 300. Interconnect anchoring points 401 are represented by circles.

Figure 5:
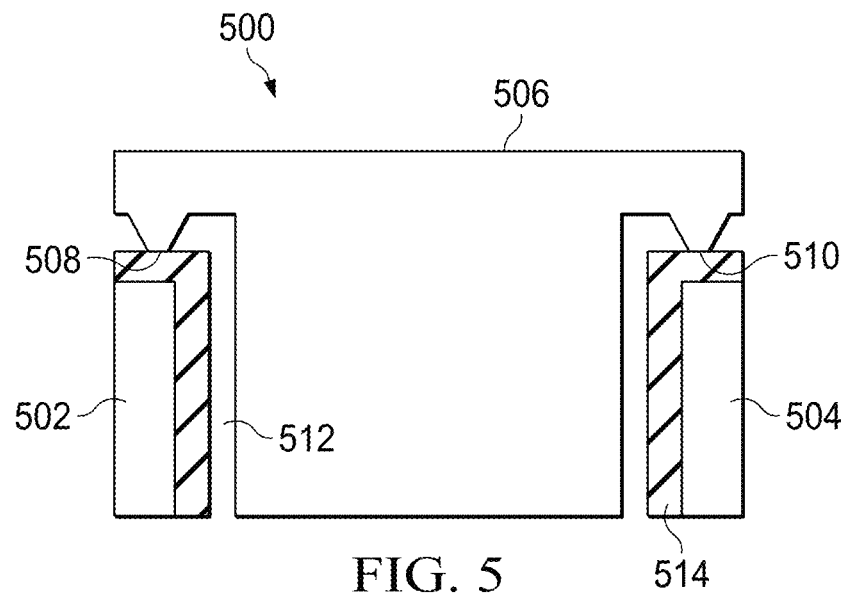
FIG. 5 is a cross-section view illustration of a cell in a cellular array electrostatic actuator in accordance with an illustrative embodiment.

Turning to FIG. 5, a cross-section view illustration of a cell in a cellular array electrostatic actuator is depicted in accordance with an illustrative embodiment. Cell 500 is an example of one implementation of cell 132 in cellular array electrostatic actuator 100 in FIG. 1.

Walls 502 and 504 of a framework define the hollow portion of cell 500. Polysilicon electrode 506 extends into the hollow portion of cell 500 between walls 502 and 504. In this example, electrode 506 is attached to walls 502 and 504 at anchor points 508 and 510, respectively. Anchor points 508 and 510 preferably are located at nodes in the framework where there is little or no deformation during operation of the cellular array electrostatic actuator.

Electrode 506 is separated from walls 502 and 504 by gap 512 and silicon nitride dielectric film 514 on walls 502 and 504. Walls 502 and 504 are pulled into gap 512 toward electrode 506 in response to applying an electrical signal between walls 502 and 504 and electrode 506, thereby contracting cell 500 and the framework that cell 500 is a part of. Dielectric film 514 prevents a short circuit between walls 502 and 504 and electrode 506 and sticking of walls 502 and 504 to electrode 506 if walls 502 and 504 are pulled into contact with electrode 506. Dielectric film 514 also may increase the breakdown field of gap 512.

Figure 6:
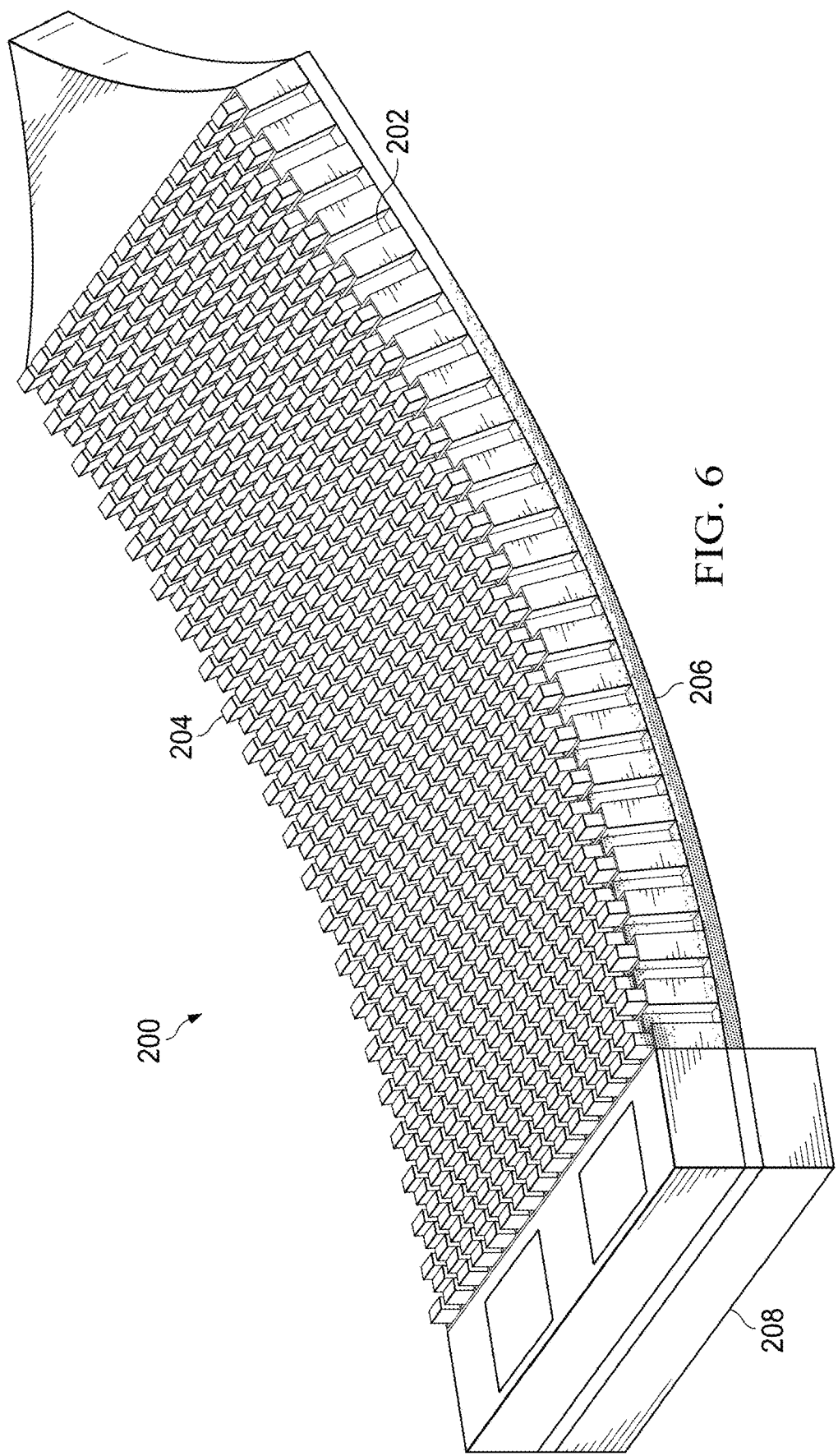
FIG. 6 is an illustration of a stress profile of a cellular array electrostatic actuator upon the application of an electrical signal to the cellular array electrostatic actuator in accordance with an illustrative embodiment.

Turning to FIG. 6, an illustration of a stress profile of a cellular array electrostatic actuator upon the application of an electrical signal to the cellular array electrostatic actuator is depicted in accordance with an illustrative embodiment. FIG. 6 is an illustration of cellular array electrostatic actuator 200 in FIG. 2 with an actuation voltage applied to cellular array electrostatic actuator 200.

Framework 202 contracts in response to applying an electrical signal between framework 202 and electrodes 204 in cellular array electrostatic actuator 200. Base 206 on the bottom side of framework 202 causes the bottom side of framework 202 to contract less than the top side of framework 202. Therefore, framework 202 bends upward in response to applying the electrical signal to cellular array electrostatic actuator 200 in this example.

Figure 7:
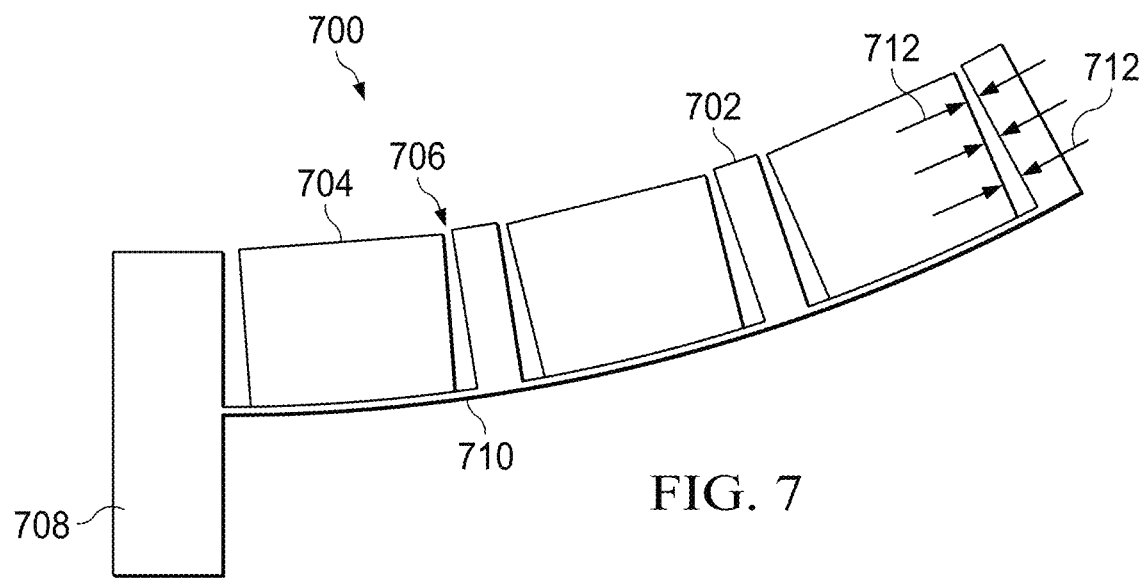
FIG. 7 is a schematic cross-section side view of a cellular array electrostatic actuator upon the application of an electrical signal to the cellular array electrostatic actuator in accordance with an illustrative embodiment.

Turning to FIG. 7, a schematic cross-section side view of a cellular array electrostatic actuator upon the application of an electrical signal to the cellular array electrostatic actuator is depicted in accordance with an illustrative embodiment. Cellular array electrostatic actuator 700 is another example of one implementation of cellular array electrostatic actuator 100 in FIG. 1.

Cellular array electrostatic actuator 700 includes a framework comprising walls 702 defining a plurality of cells forming an array of cells. Each of the cells includes electrode 704. Electrode 704 in each cell is located between walls 702 of the cell and is separated from walls 702 by gap 706. In this example, the framework of cellular array electrostatic actuator 700 is attached to support structure 708 and the bottom side of the framework is attached to flexible base 710.

Walls 702 and electrode 704 of each cell in cellular array electrostatic actuator 700 are pulled together, in the directions indicated by arrows 712, in response to applying an electrical signal between walls 702 and electrode 704, thereby partially closing gap 706 between walls 702 and electrode 704 and causing the framework as a whole to contract. Base 710 on the bottom side of the framework causes the bottom side of the framework to contract less than the top side of the framework. Therefore, the framework bends upward in response to applying the electrical signal to cellular array electrostatic actuator 700 in this example.

Figure 8:
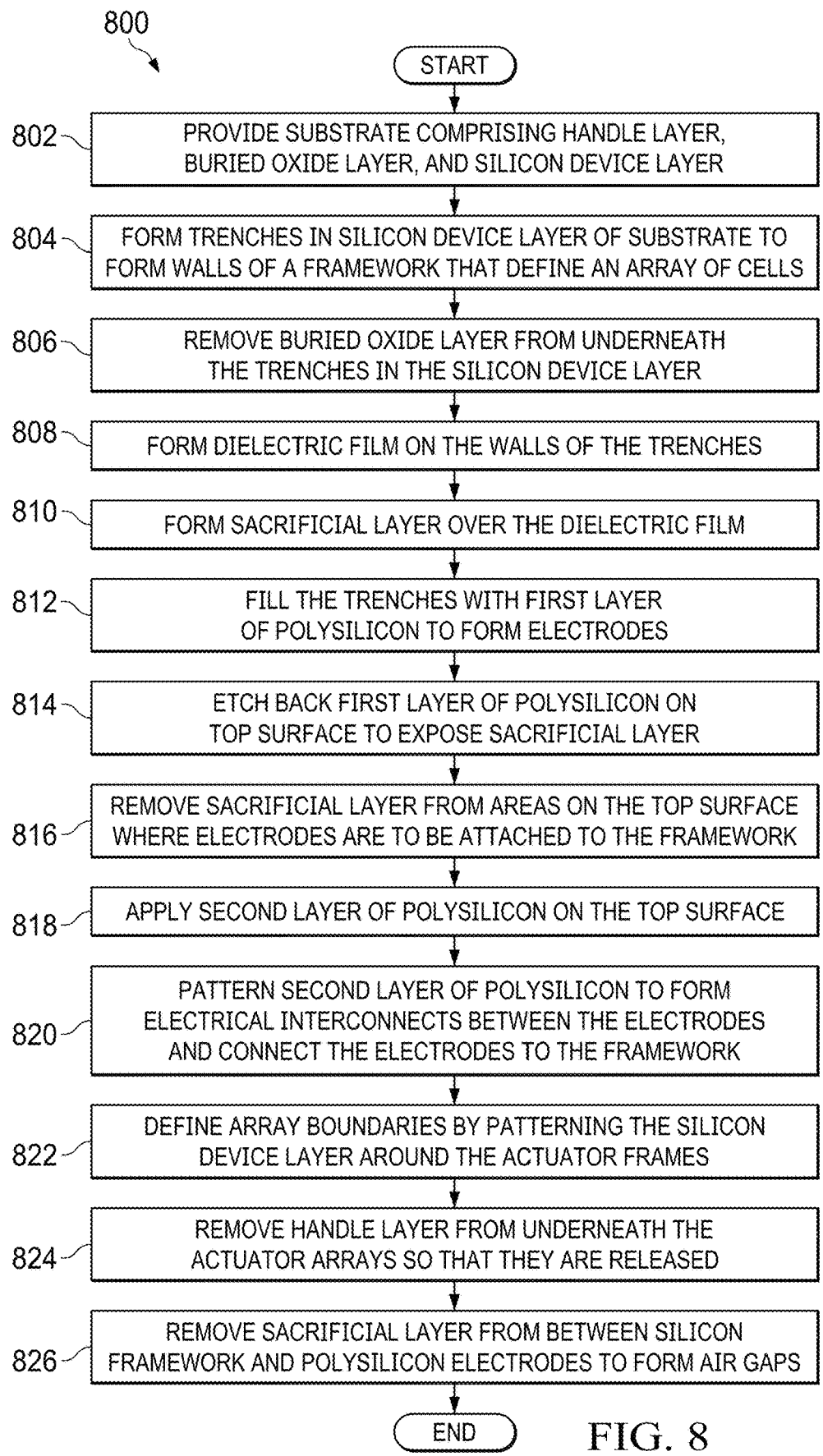
FIG. 8 is a flow chart diagram of a process of making a cellular array electrostatic actuator in accordance with an illustrative embodiment.

Turning to FIG. 8, a flow chart diagram of a process of making a cellular array electrostatic actuator is depicted in accordance with an illustrative embodiment. Process 800 is an example of one implementation of a method of making cellular array electrostatic actuator 100 in FIG. 1. With reference to FIGS. 9a-9h, schematic cross-sectional views of a portion of a cellular array electrostatic actuator are depicted at various points during making of the cellular array electrostatic actuator by process 800 in FIG. 8. For example, the schematic cross-sectional views in FIGS. 9a-9h may correspond generally to cross-sectional views taken in the general area and direction indicated by arrow 9 at various points during the making of cellular array electrostatic actuator 200 in FIG. 2.

Figure 9A:
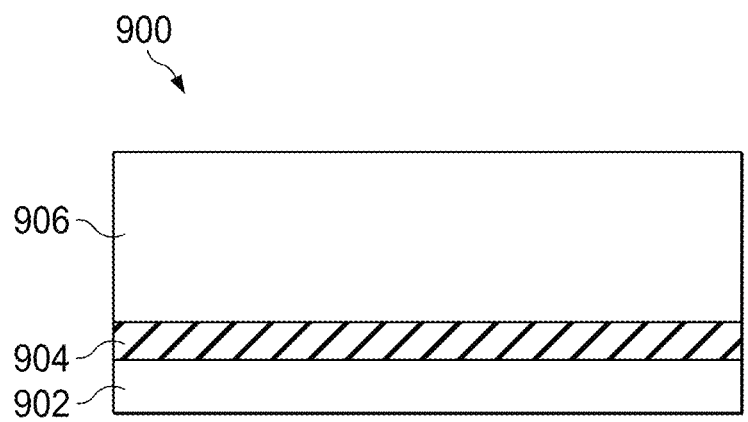
FIGS. 9a-9h are cross-sectional views of a portion of an electrostatic actuator at various points during the making of the electrostatic actuator in accordance with an illustrative embodiment.

Process 800 may begin with providing substrate 900 on which a cellular array electrostatic actuator in accordance with an illustrative embodiment will be fabricated (operation 802). With reference to FIG. 9a, a schematic cross-section view of an example of substrate 900 is depicted in accordance with an illustrative embodiment. For example, substrate 900 may be a silicon-on-insulator substrate comprising handle layer 902, buried oxide, BOX, layer 904 on handle layer 902, and silicon device layer 906 on buried oxide layer 904, such that buried oxide layer 904 is between silicon device layer 906 and handle layer 902. For example, without limitation, silicon device layer 906 may be an approximately 25 micrometer thick layer of low resistivity p-type semiconductor and buried oxide layer 904 may be approximately 4 micrometers thick. Substrate 900 comprising other appropriate materials, having other appropriate dimension, or comprising other appropriate materials and dimensions may be used for fabricating a cellular array electrostatic actuator in accordance with an illustrative embodiment.

Figure 9B:
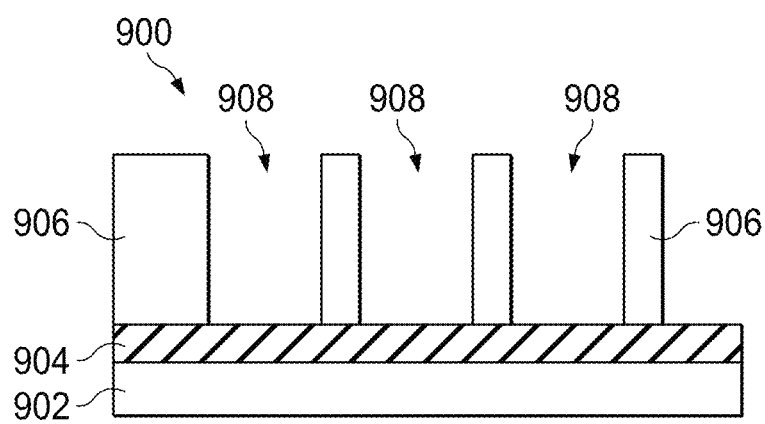

Vertical trenches 908 are formed in silicon device layer 906 of substrate 900 to form the walls of a framework that define an array of cells for a cellular array electrostatic actuator in accordance with an illustrative embodiment (operation 804). Trenches 908 preferably extend all the way through silicon device layer 906 to buried oxide layer 904. For example, trenches 908 may be formed by deep reactive ion etching, DRIE, of silicon device layer 906 or by another appropriate process. Trenches 908 correspond to the interior space between the walls of the cells in a cellular array electrostatic actuator. Operation 804 forms silicon device layer 906 into the walls that define the cells of a cellular array electrostatic actuator, while keeping silicon device layer 906 intact between different actuator arrays. With reference to FIG. 9b, a schematic cross-sectional view of an example of trenches 908 formed in silicon device layer 906 substrate 900 is depicted in accordance with an illustrative embodiment.

Figure 9C:
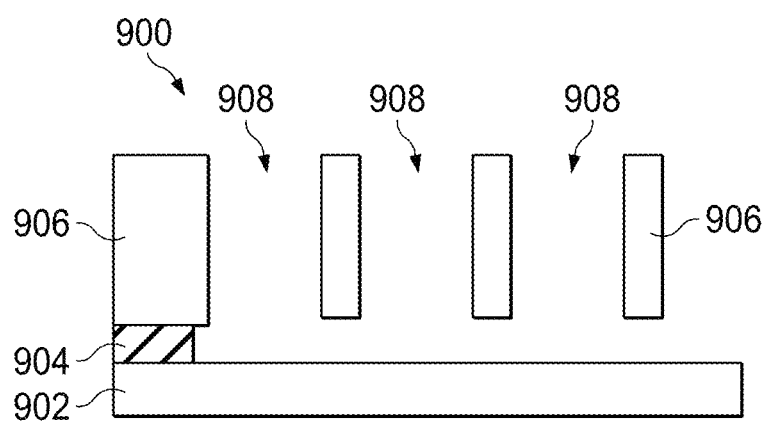

Buried oxide layer 904 then may be removed from underneath trenches 908 formed in silicon device layer 906 (operation 806). For example, buried oxide layer 904 may be removed from underneath trenches 908 by wet etching via a dip in hydrofluoric acid, HF, or in another appropriate manner. With reference to FIG. 9c, a schematic cross-sectional view of substrate 900 with buried oxide layer 904 removed from underneath trenches 908 in silicon device layer 906 is depicted in accordance with an illustrative embodiment.

Dielectric film 910 then may be formed on the walls of trenches 908 in silicon device layer 906 (operation 808). For example, without limitation, operation 808 may comprise depositing an approximately 500 nm thick conformal layer of low stress silicon nitride via low-pressure chemical vapor deposition, LPCVD, to cover the walls of trenches 908 in silicon device layer 906. Other appropriate materials, dimensions, and methods of forming dielectric film 910 may be used.

Figure 9D:
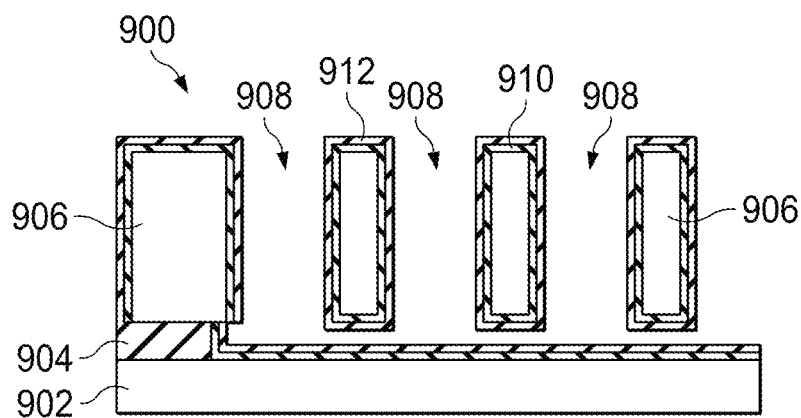

Sacrificial layer 912 then may be formed over dielectric film 910 (operation 810). Sacrificial layer 912 defines the transduction air-gaps for the actuator cells. For example, without limitation, operation 810 may comprise depositing an approximately 450 nm thick conformal layer of silicon dioxide via low-pressure chemical vapor deposition. Other appropriate materials, dimensions, and methods of forming sacrificial layer 912 may be used. With reference to FIG. 9d, a schematic cross-section view of substrate 900 with dielectric film 910 deposited on the walls of trenches 908 and sacrificial layer 912 deposited over dielectric film 910 is depicted in accordance with an illustrative embodiment. In a variation of the method described herein, a second dielectric layer may be formed over sacrificial layer 912.

Trenches 908 then may be filled with first layer of polysilicon 914 (operation 812). First layer of polysilicon 914 in trenches 908 forms the electrodes for the actuator cells. First layer of polysilicon 914 also fills the empty space underneath trenches 908 that is created after the removal of buried oxide layer 904 in operation 806. For example, without limitation, operation 812 may comprise depositing an approximately 3.5 micrometer thick layer of p-type doped polysilicon via low-pressure chemical vapor deposition. Other appropriate materials, dimensions, and methods of filling trenches 908 with first layer of polysilicon 914 may be used.

Figure 9E:
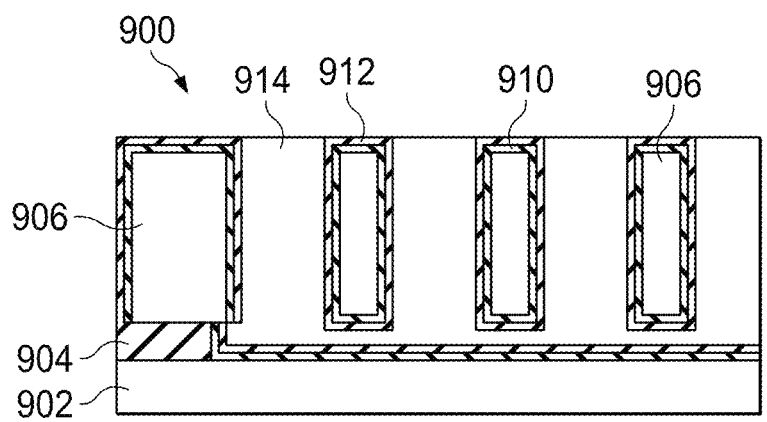

First layer of polysilicon 914 then may be etched back on the top surface to provide access to sacrificial layer 912 (operation 814). With reference to FIG. 9e, a schematic cross-section view of substrate 900 with first layer of polysilicon 914 filling trenches 908 and etched back on the top surface to expose sacrificial layer 912 is depicted in accordance with an illustrative embodiment.

Sacrificial layer 912 is then selectively patterned and removed from certain areas on the top surface to form anchor points 916 where the electrodes are to be anchored onto the silicon framework (operation 816). Anchor points 916 are preferably located at nodes in the framework where deformation of the framework when the actuator is operated is close to zero. Any appropriate known method may be used to selectively pattern and remove sacrificial layer 912.

Second layer of polysilicon 918 is then applied on the top surface (operation 818). For example, without limitation, operation 818 may comprise depositing an approximately 2 micrometer thick layer of doped polysilicon via low-pressure chemical vapor deposition. Other appropriate materials, dimensions, and methods of applying second layer of polysilicon 918 may be used.

Figure 9F:
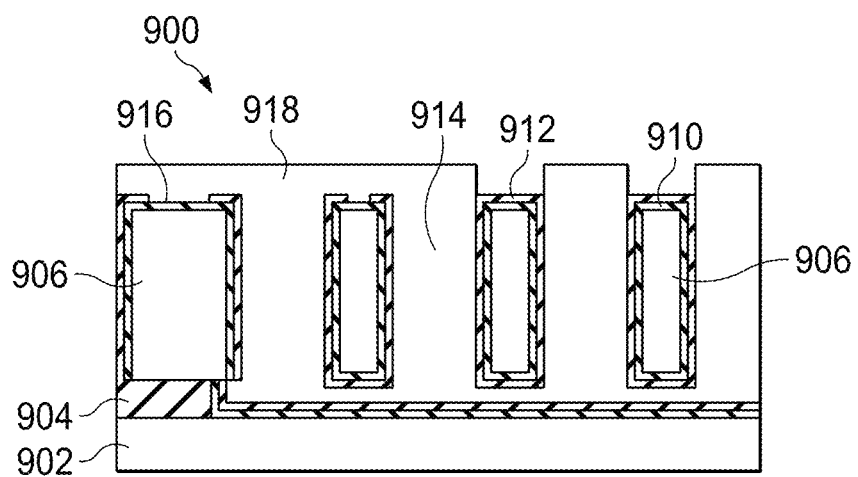

Second layer of polysilicon 918 then may be patterned to form interconnects between the electrodes and to anchor the electrodes to the silicon framework at anchor points 916 (operation 820). For example, without limitation, second layer of polysilicon 918 may be patterned via reactive-ion etching, RIE, or in any other appropriate manner. Dielectric film 910 provides electrical isolation between the polysilicon electrodes and the silicon framework at anchor points 916. With reference to FIG. 9f, a schematic section view of substrate 900 with second layer of polysilicon 918 applied on the top surface and patterned to form interconnects between the electrodes and to anchor the electrodes to the silicon framework is depicted in accordance with an illustrative embodiment.

Array boundaries then may be defined by patterning silicon device layer 906 around the actuator frames (operation 822). For example, without limitation, operation 822 may comprise patterning silicon device layer 906 by a lithography step performed on the top side of substrate 900 followed by deep reactive ion etching of the silicon device layer all the way to the buried oxide layer. Other appropriate methods of patterning silicon device layer 906 around the actuator frames to define array boundaries may be used.

Figure 9G:
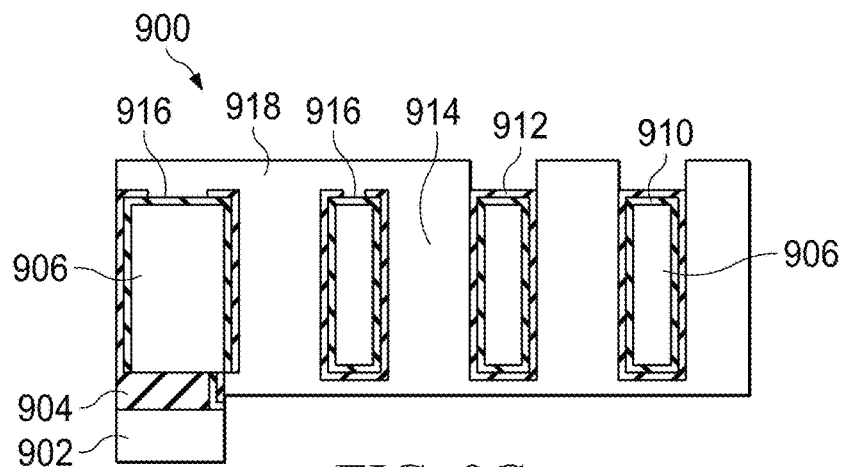

Handle layer 902 is then removed from underneath the actuator arrays so that they are released (operation 824). For example, without limitation, operation 824 may comprise performing a lithography step on the back side of substrate 900 followed by deep reactive-ion etching, DRIE, to remove handle layer 902. Other appropriate methods of removing handle layer 902 from underneath the actuator arrays may be used. With reference to FIG. 9g, a schematic cross-section view of substrate 900 with handle layer 902 removed from underneath the actuator arrays is depicted in accordance with an illustrative embodiment.

Figure 9H:
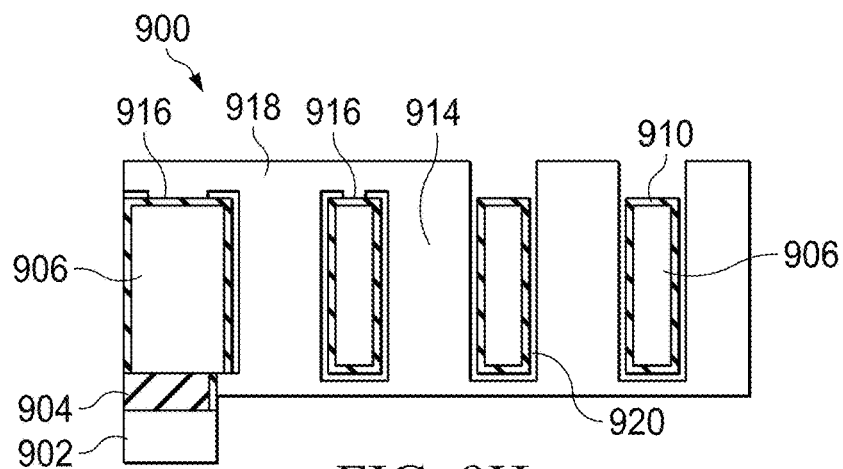

Sacrificial layer 912 then may be removed from between the silicon framework and the polysilicon electrodes to form gaps 920 (operation 826), with the process terminating thereafter. For example, without limitation, operation 826 may comprise removing sacrificial layer 912 by submersion in hydrofluoric acid for approximately 15 minutes or by another appropriate amount of time. Silicon nitride has a relatively very low etch rate in hydrofluoric acid. Therefore, most of the thickness of nitride dielectric film 910 covering the walls of the silicon framework will remain in place as sacrificial layer 912 is removed in this way. Other appropriate methods of removing sacrificial layer 912 may be used. With reference to FIG. 9h, a schematic section view of substrate 900 with sacrificial layer 912 removed to form gaps 920 is depicted in accordance with an illustrative embodiment.

In a variation of the method described herein, another sacrificial layer and another dielectric layer may be formed between first layer of polysilicon 914 and second layer of polysilicon 918.

Figure 10:
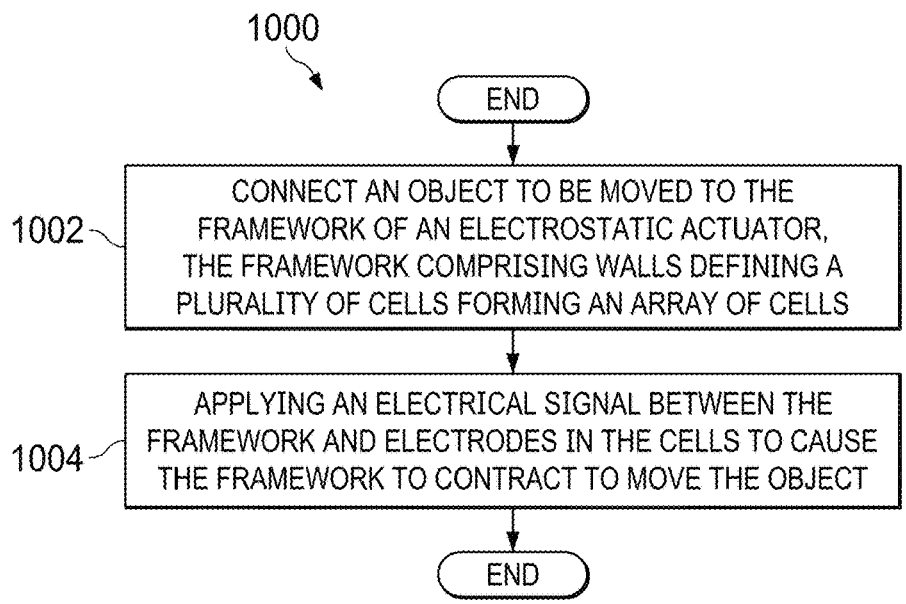
FIG. 10 is a flow chart diagram of a process of using a cellular array electrostatic actuator in accordance with an illustrative embodiment.

Turning to FIG. 10, a flow chart diagram of a process of using a cellular array electrostatic actuator is depicted in accordance with an illustrative embodiment. Process 1000 may be implemented using cellular array electrostatic actuator 100 to move object 156 in FIG. 1.

Process 1000 may begin with connecting an object to be moved to the framework of an electrostatic actuator, wherein the framework comprises walls defining a plurality of cells forming an array of cells (operation 1002). The object may comprise any appropriate object to be moved. The object may be connected to the framework of the electrostatic actuator in any appropriate manner. For example, the object may be connected to the framework of the electrostatic actuator either directly or indirectly via one or more intermediate structures between the object and the framework.

An electrical signal then may be applied between the framework and electrodes in the cells of the electrostatic actuator to cause the framework to contract to move the object (operation 1004), with the process terminating thereafter. The framework contracts in response to the application of the electrical signal as electrostatic forces pull the walls of the cells inward toward the electrodes in the cells. In accordance with an illustrative embodiment, different electrical signals may be applied independently to the framework and the electrodes in a plurality of different sub-regions of the electrostatic actuator. Applying different electrical signals independently to different sub-regions of the electrostatic actuator will cause different portions of the framework to contract independently to move the framework, and the object connected thereto, in a desired manner.

Figure 11:
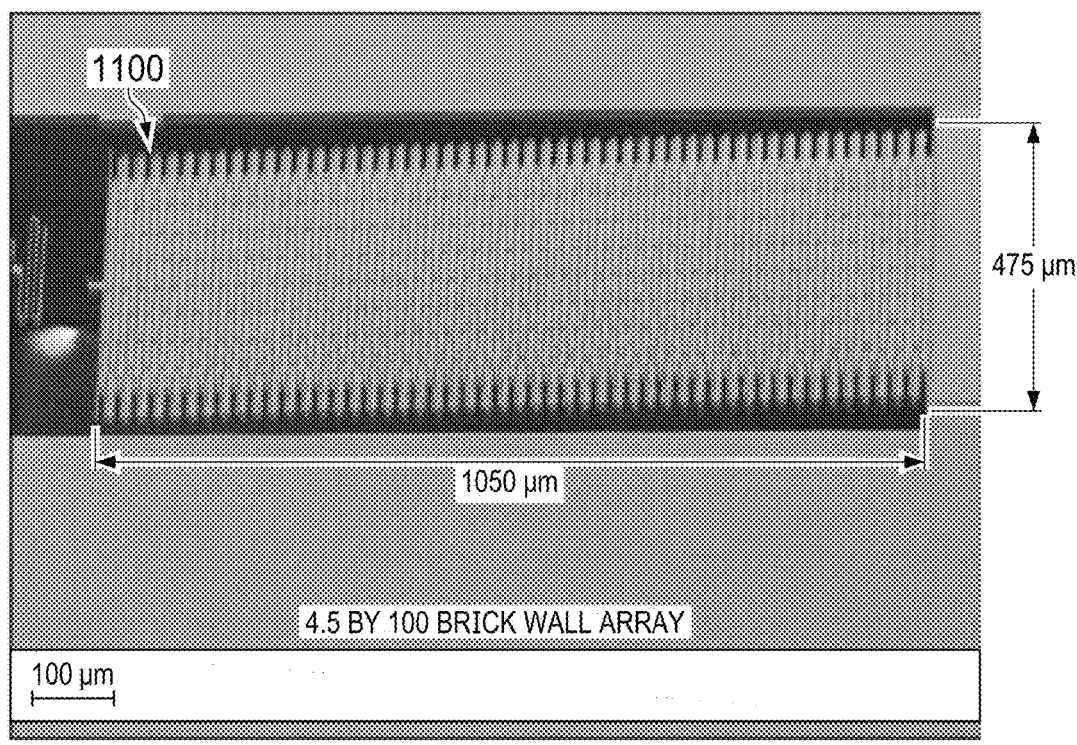
FIG. 11 is a scanning electron microscope, SEM, image plan view of a fabricated cellular array electrostatic actuator in accordance with an illustrative embodiment.

Turning to FIG. 11, a scanning electron microscope image plan view of a fabricated cellular array electrostatic actuator is depicted in accordance with an illustrative embodiment. Cellular array electrostatic actuator 1100 is another example of an implementation of cellular array electrostatic actuator 100 in FIG. 1.

The cells in cellular array electrostatic actuator 1100 are rectangular in shape and arranged in a brick wall pattern. Cellular array electrostatic actuator 1100 includes 450 cells arranged in 100 alternating rows of four cells or five cells in each row. Each cell is approximately 95 micrometers long and 10 micrometers wide. The overall size of the array of cells is approximately 1050 micrometers by 475 micrometers.

Figure 12:
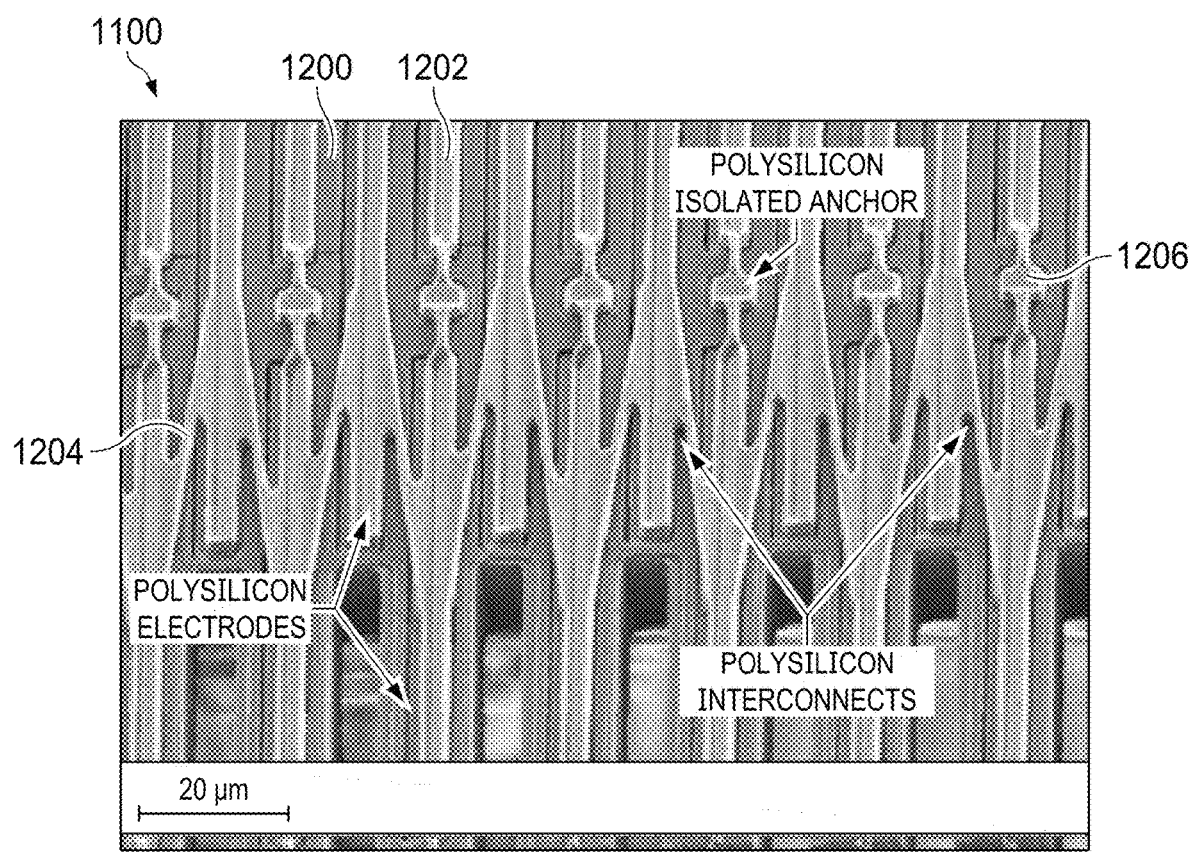
FIG. 12 is a close-up scanning electron microscope image plan view of a portion of a fabricated cellular array electrostatic actuator in accordance with an illustrative embodiment.

Turning to FIG. 12, a close-up scanning electron microscope image plan view of a portion of a fabricated electrostatic actuator is depicted in accordance with an illustrative embodiment. FIG. 12 is a magnified view of a portion of cellular array electrostatic actuator 1100 in FIG. 11.

Cellular array electrostatic actuator 1100 includes silicon framework 1200 comprising walls defining an array of cells. Polysilicon electrodes 1202 are located in the cells in framework 1200. Polysilicon electrical interconnects 1204 provide electrical connections between electrodes 1202 in the cells of framework 1200. Electrodes 1202 are attached to framework 1200 by polysilicon isolated anchors at anchor points 1206.

Figure 13:
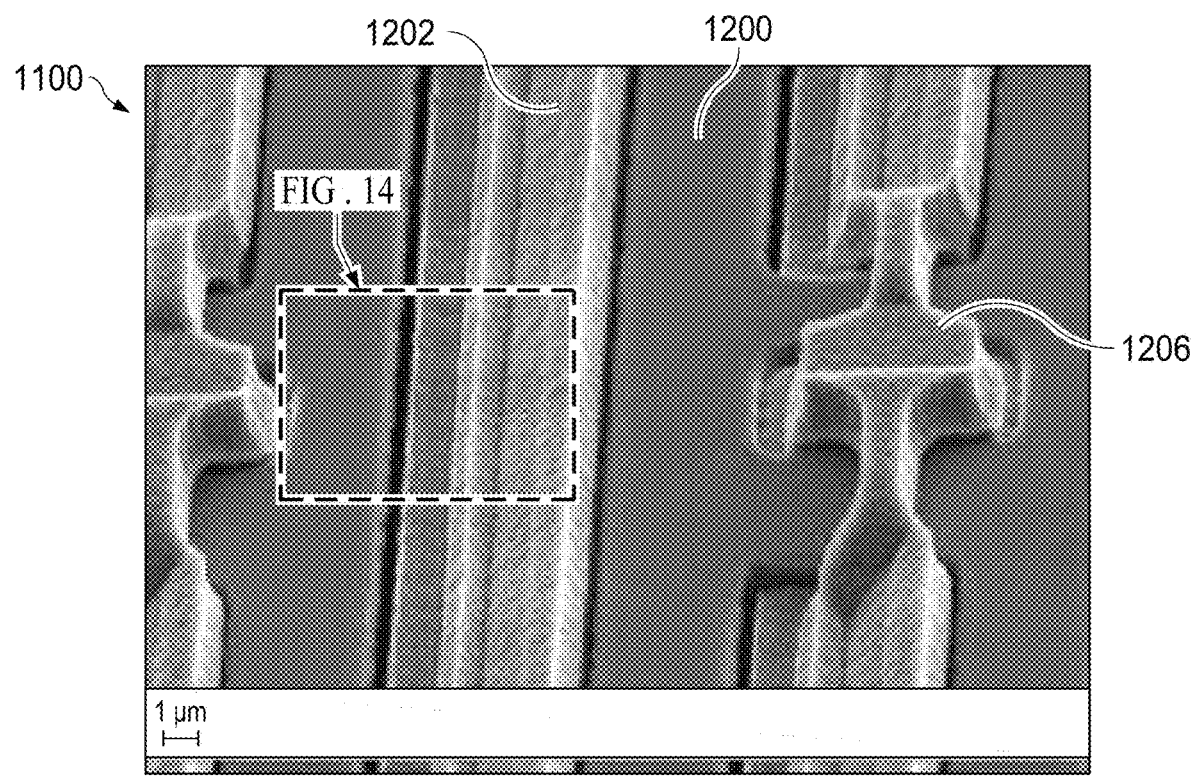
FIG. 13 is a further close-up scanning electron microscope image plan view of a portion of a fabricated cellular array electrostatic actuator in accordance with an illustrative embodiment.

Turning to FIG. 13, a further close-up scanning electron microscope image plan view of a portion of a fabricated cellular array electrostatic actuator is depicted in accordance with an illustrative embodiment. FIG. 13 is a further magnified view of a portion of cellular array electrostatic actuator 1100 in FIG. 11. FIG. 13 shows in more detail examples of portions of framework 1200, polysilicon electrode 1202, and anchor point 1206 in FIG. 12.

Figure 14:
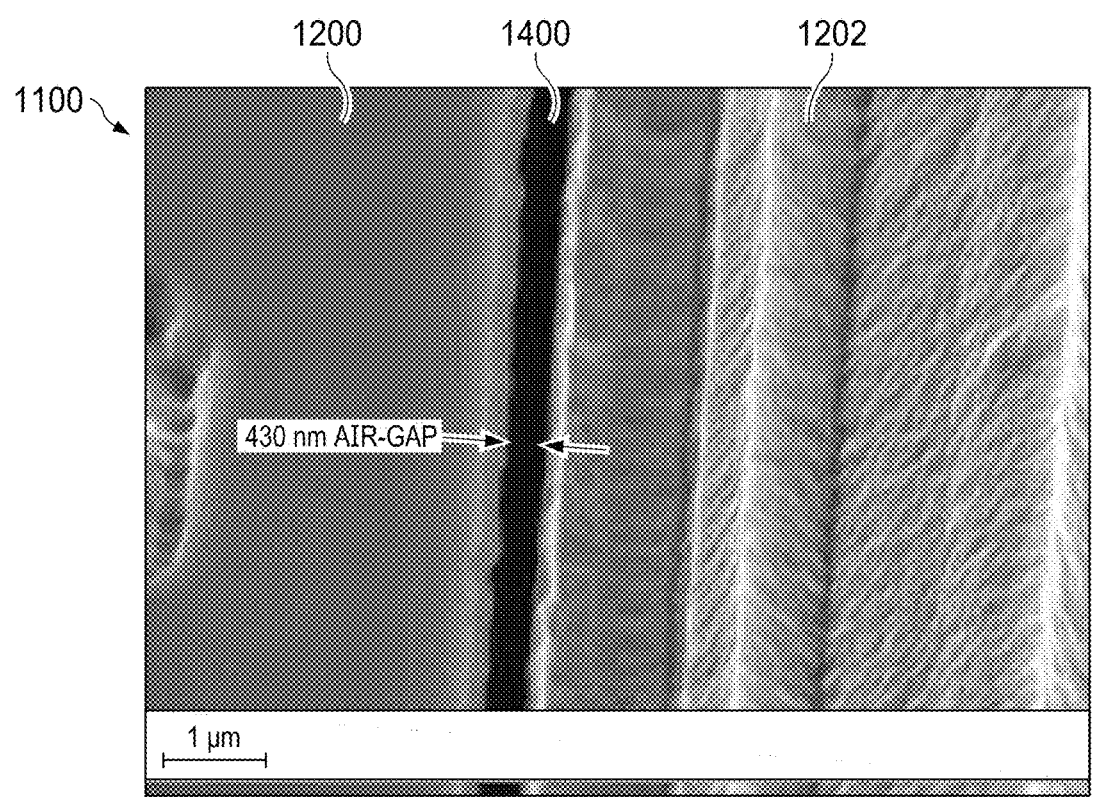
FIG. 14 is a close-up scanning electron microscope image plan view of an air gap in a portion of a fabricated cellular array electrostatic actuator in accordance with an illustrative embodiment.

Turning to FIG. 14, a close-up scanning electron microscope image plan view of an air gap in a portion of a fabricated cellular array electrostatic actuator is depicted in accordance with an illustrative embodiment. FIG. 14 is a further magnified view of portion 14 of cellular array electrostatic actuator 1100 in FIG. 13.

FIG. 14 shows in more detail portions of framework 1200 and polysilicon electrode 1202. Air gap 1400 between framework 1200 and electrode 1202 also is shown.

Figure 15:
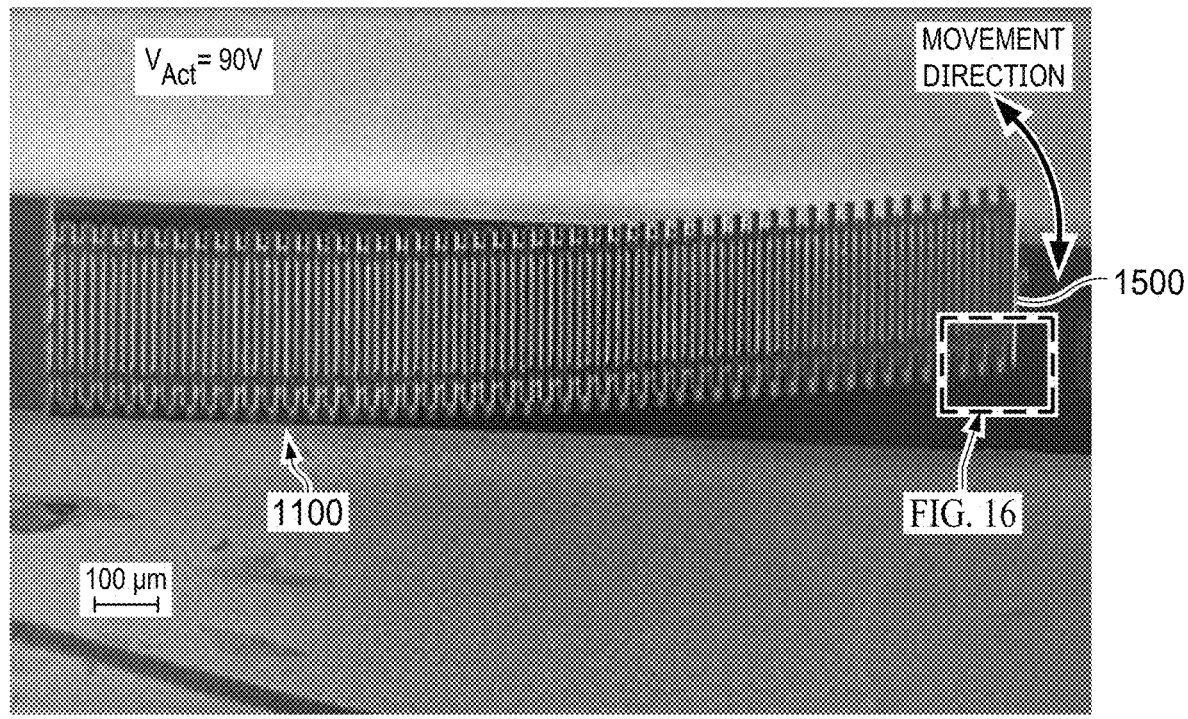
FIG. 15 is a scanning electron microscope image view of a fabricated cellular array electrostatic actuator with an electrical signal applied thereto in accordance with an illustrative embodiment.

Turning to FIG. 15, a scanning electron microscope image view of a fabricated cellular array electrostatic actuator with an electrical signal applied thereto is depicted in accordance with an illustrative embodiment. FIG. 15 shows cellular array electrostatic actuator 1100 in FIG. 11 upon application of a 90 volt actuation signal.

Upon application of the electrical signal, the framework of cellular array electrostatic actuator 1100 contracts and curves upward, taking the shape of an arch. The framework experiences a substantially uniform bending moment along its length, with slight periodic variations due to alternating rows with four and five cells. Vertical displacement at distal end 1500 of actuator 1100 is estimated from the scanning electron microscope image view to be approximately 230 micrometers in this example. Based on the measured displacement, the radius of curvature for actuator 1100 is 2.4 millimeters, corresponding to a 25.0 degree arch angle. To achieve such curvature, the top surface of actuator 1100 contracted by 11 micrometers. Each of the air gaps in each cell of actuator 1100 thus contracted by approximately 110 nanometers at the top surface of actuator 1100. Using the equation presented above, the electrostatic force acting on the walls of the individual cells in actuator 1100 is approximately 0.4 mN. The electrostatic force acting on a row of four or five cells is thus 1.6 mN to 2.0 mN, with an average force of 1.8 mN per row. With estimated flexural stiffness of 1.3 N/m at distal end 1500 of actuator 1100, and vertical displacement of 230 micrometers, the vertical force at distal end 1500 of actuator 1100 is estimated to be around 0.3 mN.

Figure 16:
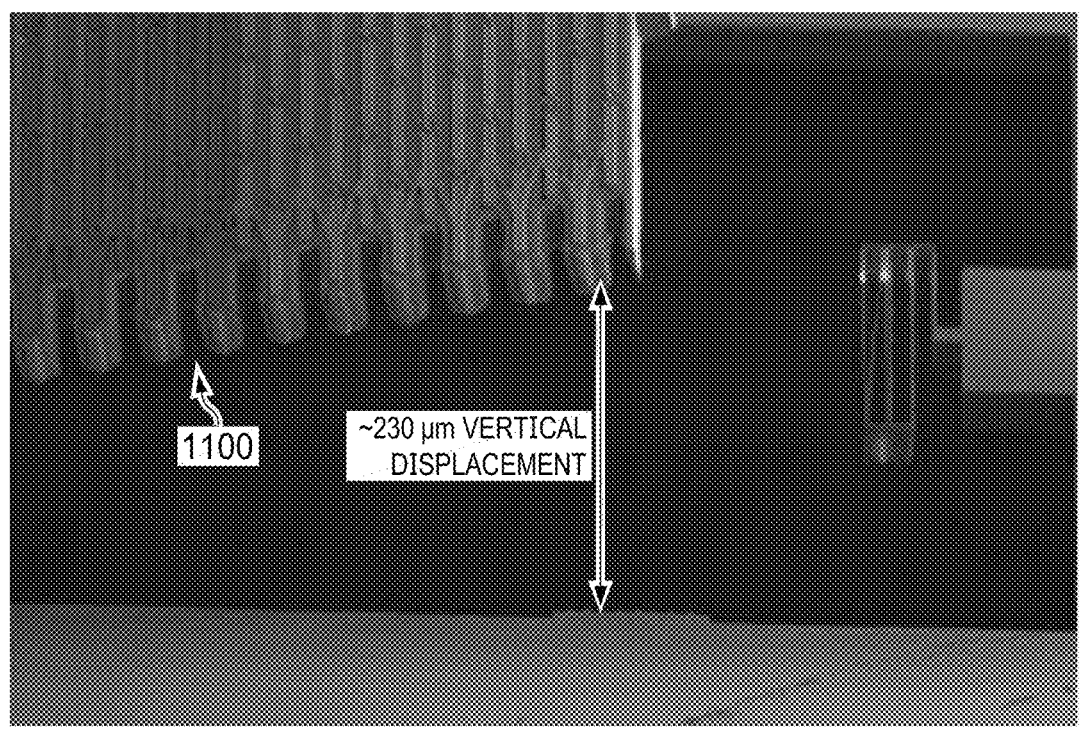
FIG. 16 is a close-up scanning electron microscope image view of a portion of a fabricated cellular array electrostatic actuator with an electrical signal applied thereto in accordance with an illustrative embodiment.

Turning to FIG. 16, a close-up scanning electron microscope image view of a portion of a fabricated cellular array electrostatic actuator with an electrical signal applied thereto is depicted in accordance with an illustrative embodiment. FIG. 16 is a magnified view of portion 16 of cellular array electrostatic actuator 1100 upon application of a 90 volt actuation signal in FIG. 15.

Figure 17:
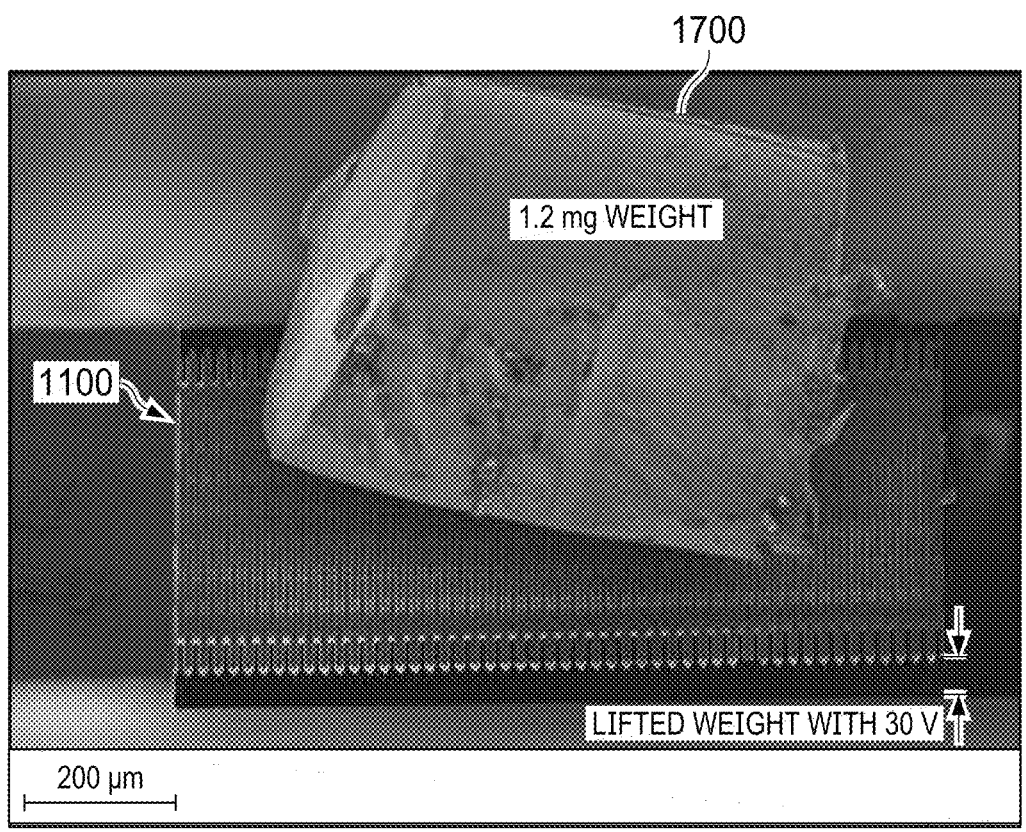
FIG. 17 is an illustration of an electrostatic actuator lifting an object in accordance with an illustrative embodiment.

Turning to FIG. 17, a scanning electron microscope image view of a cellular array electrostatic actuator lifting an object is depicted in accordance with an illustrative embodiment. FIG. 17 shows cellular array electrostatic actuator 1100 in FIG. 11 lifting object 1700.

In this example, object 1700 is a piece of copper with a mass of approximately 1.2 mg. Object 1700 in this example is about forty times heavier than cellular array electrostatic actuator 1100. Object 1700 is lifted approximately 45 micrometers by applying an approximately 30 volt activation voltage to actuator 1100. Object 1700 was thrown away from actuator 1100 upon sudden application of an approximately 40 volt activation voltage.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed here.

What is claimed is:

1. An electrostatic actuator, comprising:
a framework comprising walls defining a plurality of cells forming an array of cells;
a plurality of electrodes comprising an electrode in each cell in the plurality of cells;
a gap separating the electrode in each cell from the walls of the cell;
a plurality of flexible electrical interconnects electrically connected to the plurality of electrodes and electrically isolated and mechanically anchored to the framework at a plurality of nodes of the framework;
wherein the framework is configured to contract in response to an electrical signal applied between the framework and the plurality of electrodes;
wherein the plurality of nodes deform less than other portions of the framework when the electrical signal is applied between the framework and the plurality of electrodes;
a support structure coupled to a first portion of the framework;
a base connected to the framework that extends across at least a portion of a first side of the framework to connect together one side of at least a portion of the array of cells,
wherein cells attached to the base contract less on the first side that is attached to the base than on a second side that is not attached to base causing framework to bend when the electrical signal is applied between the framework and the plurality of electrodes; and
wherein a second portion of the framework moves with respect to the support structure in response to the electrical signal applied between the framework and the plurality of electrodes.

2. An electrostatic actuator, comprising:
a framework comprising walls defining a plurality of cells forming an array of cells;
a plurality of electrodes comprising an electrode in each cell in the plurality of cells;

a gap separating the electrode in each cell from the walls of the cell;

a plurality of flexible electrical interconnects electrically connected to the plurality of electrodes and electrically isolated and mechanically anchored to the framework at a plurality of nodes of the framework;

wherein the framework is configured to contract in response to an electrical signal applied between the framework and the plurality of electrodes; and wherein the plurality of nodes deform less than other portions of the framework when the electrical signal is applied between the framework and the plurality of electrodes, wherein the plurality of flexible electrical interconnects are configured such that the electrical signal can be applied independently to the framework and the plurality of electrodes in a plurality of different sub-regions of the electrostatic actuator.

3. A method of operating an electrostatic actuator, comprising:

applying an electrical signal between a framework and a plurality of electrodes of the electrostatic actuator using a plurality of flexible electrical interconnects electrically connected to the plurality of electrodes and electrically isolated and mechanically anchored to the framework at a plurality of nodes;

contracting, in response to the electrical signal, the framework;

wherein the framework comprises walls defining a plurality of cells forming an array of cells:

wherein the plurality of electrodes comprises an electrode in each cell in the plurality of cells:

wherein the electrode in each cell is separated from the walls of the cell by a gap;

wherein the plurality of nodes deform less than other portions of the framework when the electrical signal is applied between the framework and the plurality of electrodes;

moving a first portion of the framework with respect to a support structure coupled to a second portion of the framework;

wherein a base connected to the framework extends across at least a portion of a first side of the framework to connect together one side of at least a portion of the array of cells; and wherein cells attached to the base contract less on the first side that is attached to the base than on a second side that is not attached to base causing framework to bend when the electrical signal is applied between the framework and the plurality of electrodes.

4. A method of operating an electrostatic actuator, comprising:

applying an electrical signal between a framework and a plurality of electrodes of the electrostatic actuator using a plurality of flexible electrical interconnects electrically connected to the plurality of electrodes and electrically isolated and mechanically anchored to the framework at a plurality of nodes;

contracting, in response to the electrical signal, the framework;

wherein the framework comprises walls defining a plurality of cells forming an array of cells:

wherein the plurality of electrodes comprises an electrode in each cell in the plurality of cells:

wherein the electrode in each cell is separated from the walls of the cell by a gap;

wherein the plurality of nodes deform less than other portions of the framework when the electrical signal is applied between the framework and the plurality of electrodes; and wherein applying the electrical signal between the framework and the plurality of electrodes comprises applying different electrical signals independently to the framework and the plurality of electrodes in a plurality of different sub-regions of the electrostatic actuator to cause a plurality of different portions of the framework to contract independently.

5. A method of making an electrostatic actuator, comprising:

providing a substrate comprising a conductive material layer;

forming trenches in the conductive material layer of the substrate to form walls of a framework that define an array of cells;

forming a dielectric film on the walls of the framework and top surfaces of the framework;

forming a sacrificial layer on the dielectric film;

filling the trenches with a first layer of polysilicon to form a plurality of electrodes;

removing a first portion of the first layer of polysilicon to expose a first portion of the sacrificial layer;

removing a part of the first portion of the sacrificial layer to expose a portion of the dielectric film;

applying a second layer of polysilicon over the first layer of polysilicon and the exposed portion of the dielectric film;

patterning the second layer of polysilicon to form a plurality of flexible electrical interconnects electrically connected to the plurality of electrodes and electrically isolated and mechanically anchored to the framework at a plurality of nodes;

removing a second portion of the sacrificial layer from between the framework and the plurality of electrode to form a plurality of gaps between the plurality of electrodes and the framework;

wherein the framework is configured to contract in response to an electrical signal applied between the framework and the plurality of electrodes;

wherein the plurality of nodes deform less than other portions of the framework when the electrical signal is applied between the framework and the plurality of electrodes; and providing a support structure coupled to a first portion of the framework, wherein a second portion of the framework moves with respect to the support structure in response to the electrical signal applied between the framework and the plurality of electrodes.

6. A method of making an electrostatic actuator, comprising:

providing a substrate comprising a conductive material layer;

forming trenches in the conductive material layer of the substrate to form walls of a framework that define an array of cells;

forming a dielectric film on the walls of the framework and top surfaces of the framework;

forming a sacrificial layer on the dielectric film;

filling the trenches with a first layer of polysilicon to form a plurality of electrodes;

removing a first portion of the first layer of polysilicon to expose a first portion of the sacrificial layer;

removing a part of the first portion of the sacrificial layer to expose a portion of the dielectric film;

applying a second layer of polysilicon over the first layer of polysilicon and the exposed portion of the dielectric film;

patterning the second layer of polysilicon to form a plurality of flexible electrical interconnects electrically connected to the plurality of electrodes and electrically isolated and mechanically anchored to the framework at a plurality of nodes;

removing a second portion of the sacrificial layer from between the framework and the plurality of electrode to form a plurality of gaps between the plurality of electrodes and the framework;

wherein the framework is configured to contract in response to an electrical signal applied between the framework and the plurality of electrodes;

wherein the plurality of nodes deform less than other portions of the framework when the electrical signal is applied between the framework and the plurality of electrodes; and providing a base connected to the framework that extends across at least a portion of a first side of the framework to connect together one side of at least a portion of the array of cells, wherein cells attached to the base contract less on the first side that is attached to the base than on a second side that is not attached to base causing framework to bend when the electrical signal is applied between the framework and the plurality of electrodes.

\* \* \* \* \*